United States Patent [19]
Snopko

[11] 3,935,566
[45] Jan. 27, 1976

[54] MULTIPLE-CHANNEL INFORMATION TRANSLATION SYSTEM AND METHOD

[75] Inventor: Paul Adam Snopko, Chicago, Ill.

[73] Assignee: Zenith Radio Corporation, Chicago, Ill.

[22] Filed: Oct. 26, 1973

[21] Appl. No.: 410,000

[52] U.S. Cl........ 340/173 LM; 350/161; 340/173 R; 178/DIG. 18
[51] Int. Cl.² .......................................... G11C 13/04
[58] Field of Search... 340/173 R, 173 LM, 173 LS; 350/161

[56] References Cited
UNITED STATES PATENTS
3,744,039   9/1971   Hrbek ............................ 340/173 R

*Primary Examiner*—Terrell W. Fears
*Attorney, Agent, or Firm*—John H. Coult

[57] ABSTRACT

A multiple-channel information translation system includes a Bragg light-sound interaction cell interposed in the path of a spatially coherent input light beam. Carrier generating means generates a plural number greater than two of electrical carriers each having a different RF frequency. The carriers are respectively amplitude modulated by information-bearing input signals to produce a like plural number of amplitude-modulated carrier signals used to drive the Bragg cell. The cell Bragg-diffracts the input beam into a corresponding plural number of primary output light beams respectively amplitude-modulated in accordance with the input signals. The carrier generating means causes the frequencies, or frequencies and relative phase, of the carriers to be such that random, signal-related spurious amplitude modulation of the primary output light beams which might otherwise result from cross-channel interference effects in the cell is suppressed. In one disclosed embodiment the carrier frequencies are selected such that the frequency differences between each carrier frequency and all others are equally spaced in the frequency domain. In a second disclosed embodiment the carriers are phase-locked in order to effect the said suppression of spurious amplitude modulation of the primary output beams.

11 Claims, 4 Drawing Figures

MULTIPLE-CHANNEL INFORMATION TRANSLATION SYSTEM AND METHOD

BACKGROUND OF THE INVENTION

This invention represents an improvement on prior art multiple-channel laser image display systems, as described, for example, in U.S. Pat. No. 3,744,039, issued to my co-workers G. Hrbek, W. Watson and A. Korpel, and assigned to the assignee of the present invention. In a broader sense, however, the invention has a more general applicability and may be utilized in laser image display systems of various constructions which use a Bragg cell driven by a plurality of frequency-spaced information-bearing carrier signals to generate a fan of independently amplitude-modulated light beams.

The referent prior art systems are capable of producing high quality images, however, under certain signal conditions, spurious amplitude modulation of the writing beams may occur due to cross-channel interference effects occurring within the Bragg cell. This phenomenon manifests itself as localized spots of reduced light intensity or "drop-outs" in the displayed images. It has been found that in certain conditions the described spurious modulation can be as high as 90 percent.

OBJECTS OF THE INVENTION

It is a general object of this invention to provide a Bragg cell-type multiple-channel image display system and method in which the afore-described spurious amplitude modulation effects are suppressed, yielding optical images of quality superior to that producible by prior art systems and methods.

It is another object of the invention to provide a Bragg cell type image display system of the general nature described which has an improvement by which "drop-outs" in the displayed images are suppressed, and yet which improvement is relatively simple and inexpensive to implement.

BRIEF DESCRIPTION OF THE DRAWINGS

The features of the invention which are believed to be novel are set forth with particularity in the appended claims. The invention, together with further objects and advantages thereof, may best be understood, however, by reference to the following description taken in conjunction with the accompanying drawings, and in which:

DESCRIPTION OF THE PREFERRED EMBODIMENT

As discussed above, in one sense this invention involves a system and method for improving the quality of laser-displayed images provided by systems of the nature described in the referent Hrbek et al patent. In order to provide a background for the present invention, a brief description of the Hrbek et al multiple-channel laser display system will first be engaged.

Figure 1:
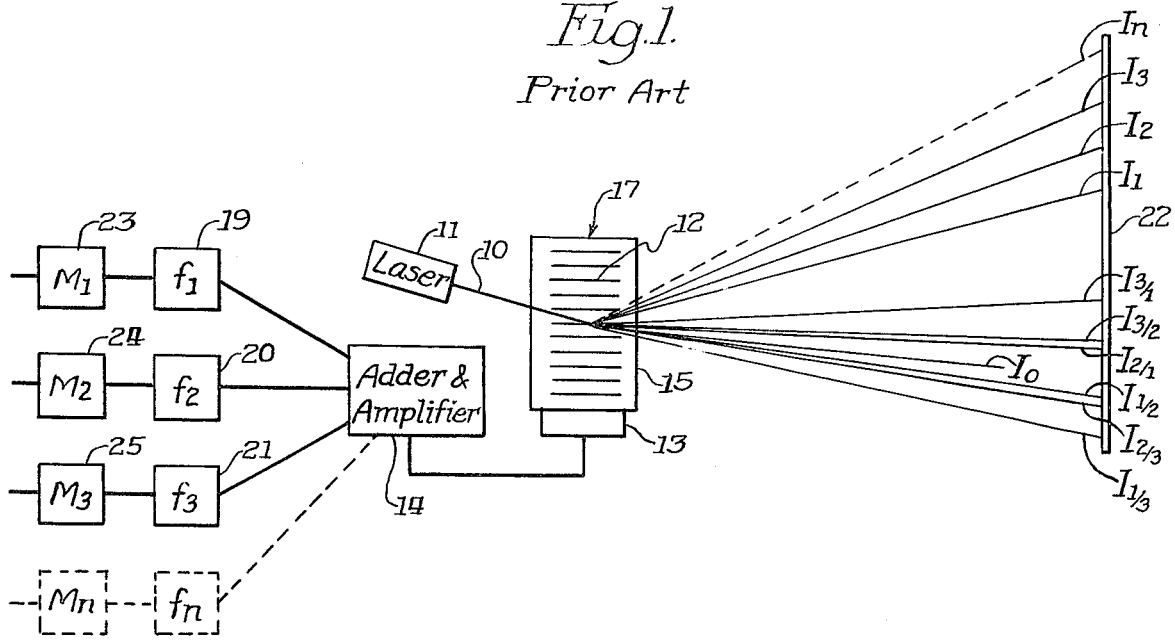
FIG. 1 is a block diagram of a prior art multiple-channel information translation system of the nature described in the referent Hrbek et al patent, illustrating the prior art relationship between the first order output light beams (the "primary" beams) and certain "secondary" output light beams.

Referring to FIG. 1, in the Hrbek et al system a beam of light 10 is produced by a laser 11 and fed into a Bragg light-sound cell 17. A series of sound waves 12 are launched in the cell 17 by a transducer 13 excited by a suitable signal source 14 (to be described). The sound waves propagate across the path of beam 10 in a medium 15, such as water or glass, confined to an enclosure having sidewalls transparent to beam 10.

Light beam 10 is incident upon sound waves 12 in the cell 17 at approximately the Bragg angle $\beta$, a portion of the light beam being diffracted and emerging from cell 17 along a path forming an angle $2\beta$ with the undiffracted beam portion. The light diffracted in the cell 17 propagates to image screen 22. Bragg angle $\beta$ is determined in accordance with the wellknown Bragg relationship:

$$\sin \beta = \pm \lambda/2W,$$

where $\lambda$ is the mean wavelength of the light beam and $W$ is the wavelength of the sound wave pattern. In typical applications, the actual value of angle $\beta$ is sufficiently small so that the left term in the Bragg equation may be reduced to the angle $\beta$ itself.

As will be evident from an examination of the Bragg equation, the value of the diffraction angle $2\beta$ is a function of the wavelength (or frequency) of the sound waves and, hence, is correspondingly a function of the frequency of the signals generated by the signal source exciting transducer 13. In the illustrated educative example, the signal source 14 is an adder and power amplifier. The source 14 receives the output of three oscillators 19, 20 and 21 of different predetermined frequencies $f_1$, $f_2$ and $f_3$, respectively. Three information-bearing output signals, applied at 18a, 18b and 18c, are impressed on the carriers produced by oscillators 19, 20 and 21 by means of amplitude modulators 23, 24 and 25. Thus adder/amplifier 14 simultaneously receives three carrier signals, individually of a different frequency and an independently controlled amplitude, and applies their sum to transducer 13.

In response to such excitation, cell 17 diffracts the input light beam 10 into three light beams $I_1$, $I_2$ and $I_3$. The three beams $I_1$, $I_2$ and $I_3$ in turn develop three corresponding spots spaced along screen 22 in the direction of sound propagation, here the vertical direction. The three spots individually have respective intensities corresponding to the respective amplitudes of the three carrier signals of frequencies $f_1$, $f_2$ and $f_3$. Each of the spots has a position on screen 22 and an intensity or brightness corresponding to the frequency and amplitude, respectively, of a particular one of the signal components added together by adder 14.

The number of carrier signals simultaneously developed by adder 14 may be increased to any number up to a limit determined by the resolution N of the sound cell 17. This may be accomplished, for example, by the addition of more oscillators, each of a different predetermined frequency and a corresponding number of modulators, as a result of which cell 17 would diffract a corresponding plurality of beams to produce a like plurality of spots distributed across screen 22.

Thus, each of the plurality of signals supplied by the oscillators 19, 20 and 21 are associated with a corresponding plurality of image elements, each signal respectively representing one of such elements in position and amplitude. To produce a two-dimensional representation, the resultant fan of beams must be scanned in a direction orthogonal to the fan, while the intensity of each individual beam is varied as it is scanned in accordance with the time variations in the amplitude of its respective carrier signal. To effectuate this scan, a generally similar system may be employed to move the light beams in the orthogonal direction, with the sound frequency value in such system being repetitively scanned through a predetermined frequency range so that the value of the diffraction angle, which is a function of the frequency of the sound waves, will vary accordingly. However, if the required scan rate is not excessively great, a simple galvanometer-controlled mirror or, as in slow recording systems, a recording medium transport may be employed to accomplish the required relative orthogonal motion.

Figure 2:
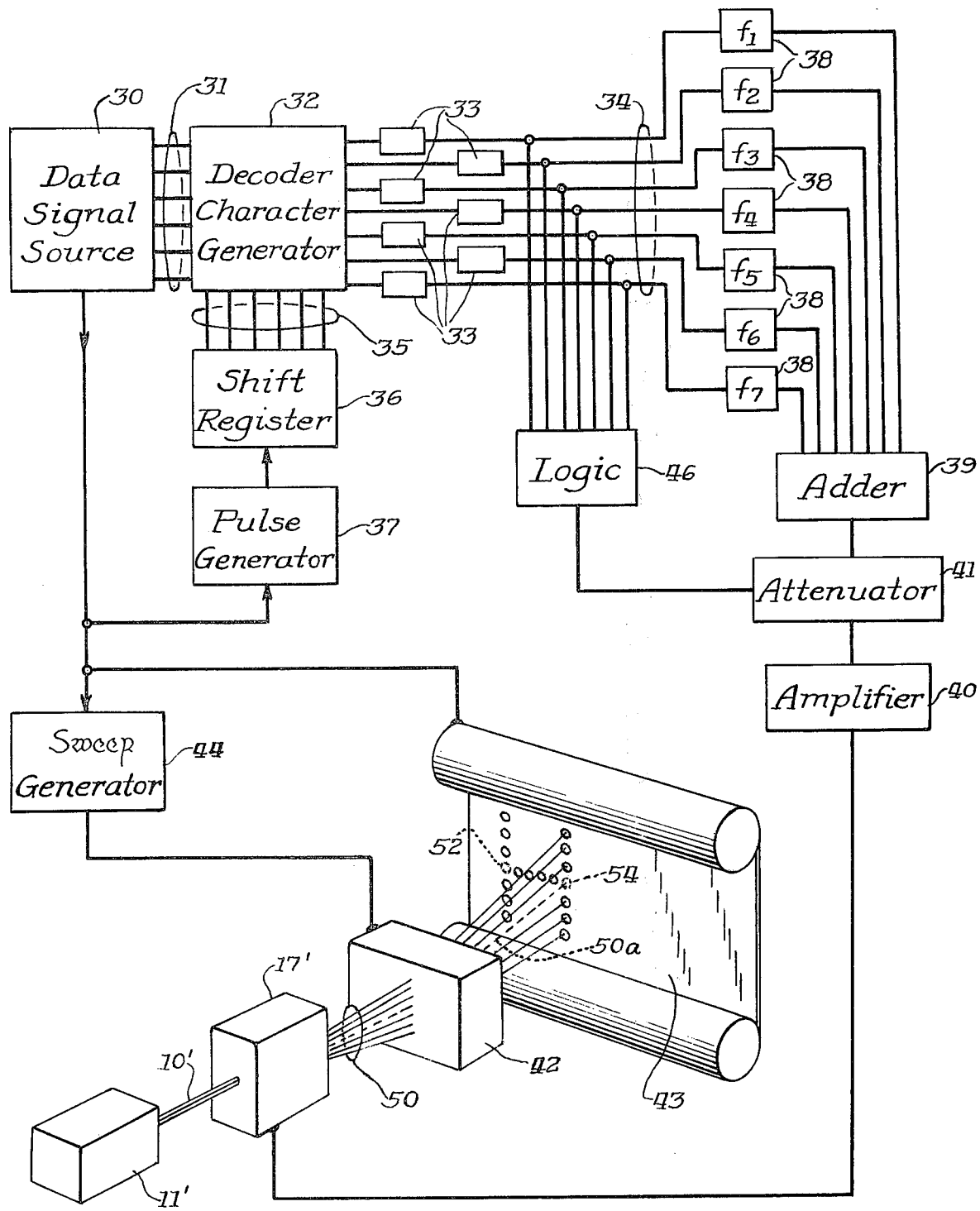
FIG. 2 is a more detailed schematic illustration of the prior art Hrbek et al information translation system.

FIG. 2 depicts in more detail than FIG. 1, an embodiment of the Hrbek et al invention. The FIG. 2 system is designed to reproduce alphanumeric image information from a multi-channel source of input signals. In the particular system illustrated, the input signals are supplied by a data signal source 30, which may take the form of a computer output, delivering character control signals over a plurality of parallel channel output lines 31. The lines 31 are simultaneously energized by the data source 30 so that together the control signals comprise a pattern of ON-OFF states, preferably in accordance with a standard binary code such as the "ASCII Code."

Each output line is connected to a corresponding input of a decoder and character signal generator 32. One commercially-available example of such a decoder-character generator 32 which may be employed in the FIG. 2 system is the Model TMS-4103 JC system sold by Texas Instrument Corporation. The decoder-generator 32 decodes the coded data source signals into a plurality of gate signals, each corresponding to a different line in a raster of image lines defining a line of characters. The sources of the individual independent gate signals, depicted schematically at 33 here, are actually integral with decoder-generator 32; however, it is to be understood that in other systems not utilizing a decoder-generator of the afore-mentioned type, the gate signal sources 33 may be physically separate. In other systems, instead of data source 30, a non-coded source of digital information may be used which also has a plurality of channels and corresponding output lines which control an array of separate gate signal sources directly. In any case, the gate signal sources 33 are driven to sequentially deliver over respective output lines 34 the columns of a row-and-column-matrix representation of the desired characters.

In the FIG. 2 system, the decoder-generator 32 is compatible with the afore-mentioned standard code and supplies gate signals for the production of characters of the 5 × 7 matrix type over seven output lines 34. To accomplish this, it incorporates five column-select control leads 35, which are connected to respective leads of a 6-position shift register 36 distributing sequentially the pulses from a column-select pulse generator 37 controlled by data source 30. The columns of each character are generated sequentially by decoder-generator 32 in response to corresponding pulses over the five control leads 35 from column-select generator 37. The pulse generator 37 and register 36 are synchronized to data source 30 and its rate of delivery of character information.

The output lines 34 of gate signal sources 33 are coupled to respective oscillators 38. The oscillators 38 may be of the character described in FIG. 1, except that seven oscillator units are employed, one for each row of the character, and each oscillator is gated OFF or ON at full power in accordance with the absence or presence of a signal on its associated one of lines 34. In the prior art Hrbek et al system, the frequencies of each of the oscillators 38 are spaced evenly, for example, over a 20 megahertz interval from 30 to 50 megahertz in 3⅓ megahertz increments. An adder 39 and power amplifier 40 perform the same function as does adder-amplifier 14 of the FIG. 1 system, except that an amplitude-regulating attenuator 41 is also included for adjusting the intensity of the diffracted output beams as a function of the number of beams ON, as described and claimed in the referent Hrbek et al patent. As in FIG. 1, the resultant signal from power amplifier 40 powers Bragg cell 17' to diffract beam 10' from laser 11' into a plurality of equally spaced beams, in this case seven, since seven discrete spaced frequencies are employed.

Bragg cell 17' should have a substantially linear frequency response in order that the power necessary to diffract light of a given intensity is nearly the same for each of the frequencies applied to the cell. Although for many applications such a response characteristic is easily obtained sufficiently approximated by using cells having wide tolerances and bandwidths, one way to positively assure that the cell will have the proper range and quality of response is to utilize the principles of acoustic beam steering set forth in U.S. Pat. No. 3,493,759 to Robert Adler and assigned to the assignee of this invention. This patent teaches the use of a soundcell transducer comprised of a plurality of steps, the arrangement being termed "an echelon transducer array." The action of the echelon transducer array is to cause sound beams generated at various frequencies to each have a direction related to its frequency. The direction of each sound beam is such that a fixed input light beam is diffracted by each of the varied frequency sound beams at the Bragg angle.

The seven output light beams are diffracted as a fan of beams 50 from cell 17' and are received by a second Bragg cell 42 operating as a deflector for deflecting these beams in a direction orthogonal to that of the diffraction of the first cell 17' (here, in the horizontal direction) over a display or recording medium 43. This is accomplished by a frequency sweep generator 44 which supplies a scan signal to cell 42 in the form of a linear frequency ramp sweeping repetitively through a predetermined frequency range, i.e., 40 megahertz, determined by the value of the total diffraction angle which is desired. Characters are generated by the controlled ON-OFF action of the individual diffracted beams as the fan 50 of seven diffracted beams from the cell 17' is scanned in the horizontal direction by cell 42. ON-OFF gating of the individual beams occurs in response to the ON-OFF gating of each of the oscillators 38 by signals over the output lines 34 from character decoder-generator 32. The rate of information delivery of the data source 30 and the sweep generator 44 are synchronized so that a complete line of character information is displayed with every scan of generator 44 and cell 42. Since the intrinsic speed capability of a Bragg cell deflector is very high, high rates of character generation may be accomplished.

Although the lines of information scanned out by the apparatus may be directly displayed, in which case medium 43 is a display screen, in the FIG. 2 embodiment the information is recorded, as is usual in high-speed computer information readout applications, and medium 43 is a high-speed photographic film. A film transport mechanism (not shown) advances a new portion of film after each line of information is scanned, in response to the line start synchronization signal from data source 30 in the same manner as for scan generator 44 and column-select pulse generator 37. The film transport mechanism may be any one of those known in the art and commercially available for the purpose. The film medium is advanced in the direction orthogonal to that of the scanning of cell 42, in this case the vertical direction, sufficient to prevent overlap of the recorded lines of information, and is of a width sufficient to contain the complete angular scanning range of cell 42.

Although the specific embodiment being described is especially for reproduction of alphanumeric information, the system may be adapted to non-alphanumeric image information with useful gray scale, given suitable respective modulating signals for the control of the power output of the oscillators 38.

As intimated above, under certain signal conditions, prior art systems as described above may, as a result of spurious amplitude modulation of the writing beams 50, have "drop-outs" in the recorded images. To elaborate — the FIG. 2 system is illustrated as writing the character "H" with its seven writing beams 50. It can be seen that the writing beam 50a has been suppressed by the afore-mentioned spurious modulation during formation of the vertical bars of the letter "H" (an all-beams-ON condition), resulting in drop-outs at character elements 52 and 54. It should be noted that the same writing beam 50a is not suppressed in writing the horizontal bar in the letter "H," a signal condition wherein the beam 50a is the only beam ON. Thus, it is seen that the spurious amplitude modulation is signal-related.

It can be appreciated that in the display or recording of high resolution alphanumeric information, or even in the display or recording of continuous tone imagery, that such drop-outs will seriously degrade the quality of the images produced. It is a stated object of the present invention to overcome the described problem of drop-outs in images produced by systems of the character described. A number of systems and methods are described herein for achieving this end, however, before engaging in a discussion of these, the nature and origin of the afore-mentioned spurious modulation will be explored.

It is believed that the afore-described spurious amplitude modulation of the writing beams in an information translation system of the character depicted can be described in terms of rediffraction of the primary output light beams, i.e., the writing or displaying beams. In an acousto-optic modulator of the Bragg diffraction type, the light diffracted into the first diffraction order will be rediffracted into the zeroth order, into the second order, and into higher orders. In multiple frequency operation, part of the light diffracted by acoustic waves of one frequency will be rediffracted by waves of other acoustic frequencies as well as the one which initially diffracted it.

In order to further an understanding of this phenomenon and its relevance to this invention, reference will again be made to the FIG. 1 schematic illustration of the prior art Hrbek et al system. The resultant diffraction pattern produced by the FIG. 1 system using three acoustic frequencies is shown in FIG. 1.

At the output of the cell 17 appears primary output light beams $I_1$, $I_2$ and $I_3$ and secondary output light beams (to be described) $I_{3/1}$, $I_{3/2}$, $I_{2/1}$, $I_{1/2}$, $I_{2/3}$ and $I_{1/3}$. $I_0$ represents the zeroth order beam. The six secondary output beams are diffracted at the diffraction angles associated with the six difference frequencies between the applied signals. In FIG. 1 these beams are labeled $I_{3/1}$, indicating the primary beam $I_3$ rediffracted by the acoustic waves $f_1$, i.e., the acoustic wave patterns generated by the carrier of frequency $f_1$, $I_{3/2}$ indicating the primary beam $I_3$ rediffracted by the acoustic waves $f_2$, and so forth.

In the described prior art system, as might be expected the carriers $f_1$, $f_2$ and $f_3$ are caused to be equally spaced in the frequency domain such that the primary beams $I_1$, $I_2$ and $I_3$ have equal angular spacing and will therefore produce image spots which are equally spaced in the displayed image. As can be seen in FIG. 1, the selection of carriers having equally spaced frequencies results in near coincidence of certain of the secondary beams in the frequency domain, e.g., of $I_{3/2}$ with $I_{2/1}$.

In a multiple beam Bragg cell information display system of the character described, all of the light supplied to the cell in the input light beam (neglecting losses in the cell) is distributed among the diffracted output beams. A very substantial percentage of the total light leaving the cell 17 falls in the first order primary beams or in the described secondary beams. For purposes of this discussion, any remaining output light diffracted from the cell 17 will be neglected. It can thus be seen that light which is not diffracted into the primary beams $I_1$, $I_2$ or $I_3$ appears in the secondary beams. If conditions are right in the cell 54 for destructive interference between certain secondary beams, i.e., for example, for destructive interference to occur between the overlapped beams $I_{3/2}$ and $I_{2/1}$, then the light which would have otherwise appeared in these secondary beams will appear in the primary beams. Conversely, additive interference between two secondary beams can result in a concentration of light in the secondary beams at the expense of light in one or more of the primary writing beams. When such latter cross-channel interference effects occur, the result may be a severe drop-out in the image being written by the writing beams $I_1$, $I_2$ and $I_3$.

The described spurious amplitude modulation is dependent upon the applied signal in two respects. First, the number of output beams turned "on" at any instant must be greater in number than two. In systems of the character described above, if two or fewer beams are energized at any instant, the afore-mentioned cross-channel interference effects will not take place, and the resultant spurious amplitude modulation will therefore not occur.

Second, the spurious modulation depends upon the carrier frequencies of the carrier signals which constitute the summed input signal supplied to the fan-producing Bragg cell (17' in FIG. 2). More specifically, the spurious amplitude modulation depends upon the spacing in the frequency domain of the difference frequencies between the carriers. Stated another way, the spurious amplitude modulation depends upon the difference of the difference frequencies. This will be made clear by the following example. If, for example, the prior art laser character generation system employed seven carrier frequencies spaced by 0.5 MHz ± 5 kHz, a spurious, signal-modulating beat note will be generated which will have a frequency between 0 and 20 kHz. If for example, the beat frequency were 20 kHz, the spurious amplitude modulation of the primary output light beams would be so rapid that for slow character writing speeds, the spurious amplitude modulation would not be detectable. However, at very fast writing speeds, even a 20 kHz spurious modulation frequency would produce visible drop-outs in the display or recorded images.

The spurious amplitude modulation in a commercially practicable execution will also be random, due to drifting in phase and frequency of the (uncoupled) oscillators (38 in FIG. 2). Thus, the described spurious amplitude modulation is both random and signal-dependent.

This invention is directed to overcoming the afore-described drop-out problem in information translation systems of the character described which is due to the afore-discussed spurious amplitude modulation. In accordance with this invention, a plural number greater than two of electrical carriers is generated, each having a different RF frequency. Each of the carriers is amplitude-modulated with a different input signal so as to develop a like plural number of modulated carrier signals respectively representing a different image line in a raster of image lines.

The carrier signals are supplied to a Bragg acousto-optic cell to cause Bragg diffraction of at least a part of the input laser beam into a like plural number of coplanar, angularly separated first order output light beams, each amplitude modulated in accordance with a different one of the input signals. The terms "amplitude-modulated" and "amplitude modulating" are used herein in a broad sense to mean any altering of the height of a signal waveform to convey information, as opposed to its phase or frequency, for example, and is intended to encompass, e.g., ON-OFF gating of a carrier wave.

In order to develop a two-dimensional image or a line of characters at an output plane, relative movement between the primary light beams and the image surface is produced, as by deflection of the output light beams as a fan of beams in a direction perpendicular to the plane containing the beams. The frequencies, or frequencies and relative phase, of the carriers are caused to be such as to substantially suppress cross-channel interference effects between the carrier signals tending to produce spurious modulation of the output beams.

Figure 3:
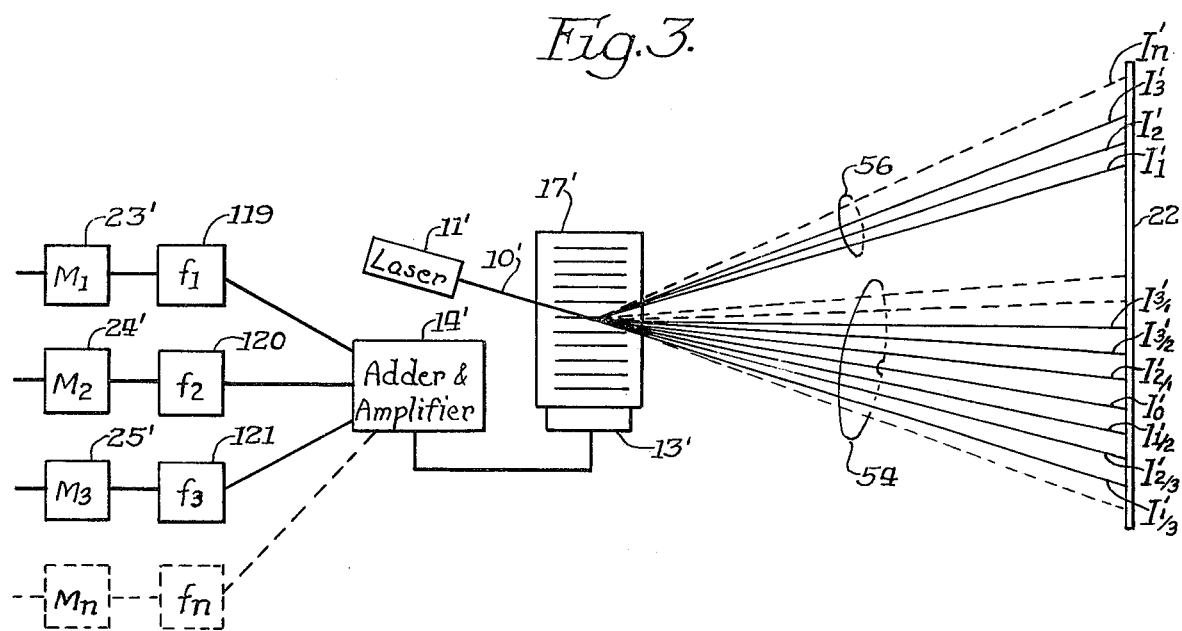
FIG. 3 is a block diagram similar to FIG. 1 but illustrating the present invention and in detail depicting the novel relationship between the primary and secondary output light beams.

In a preferred embodiment of the invention, depicted schematically in FIG. 3, the described spurious modulation is suppressed by selecting the carrier frequencies such that the frequency differences between each carrier and all others are unequal. FIG. 3 is a block diagram corresponding to the FIG. 1 diagram but illustrating the principles underlying the said preferred implementation of the invention. In the FIG. 3 system, primed reference numerals denote components which correspond to components of the FIG. 1 system having like unprimed reference numerals. The novel FIG. 3 system differs from the prior art FIG. 1 system primarily in the frequencies of the carriers generated by the carrier-generating oscillators 119, 120 and 121. In accordance with the present invention, as shown clearly in FIG. 3, the carrier frequencies $f_1, f_2$ and $f_3$ are chosen according to this invention such that the secondary output light beams 54 are equally spaced in the frequency domain. By thus selecting frequencies of the carriers generated by oscillators 119, 120 and 121, overlap of the secondary light beams in the frequency domain, and thus the possibility of interference therebetween in the cell 17', is precluded. By precluding interference between the secondary output light beams 54, the misallocation of light from the primary output light beams 56 into the secondary beams 54 by signal-related interference effects occurring in the cell 17' is substantially precluded.

In one execution of this embodiment of the invention, the secondary beams 54 are caused to be substantially equally spaced in the frequency domain, that is, the frequencies representing the differences between each of the carrier frequencies and all others are caused to be substantially equally spaced in the frequency domain. This selection of frequencies implies, as shown in FIG. 3, that the primary output beams 56 are angularly spaced increasingly far apart. The spots which are written by the primary beams 56 are thus not equally spaced on the output plane, however, this has not proven to be a significant drawback to systems constructed according to this invention. The difference increment between the frequencies of the primary output beams 56 is caused to be small such that the increment in angular separation of the beams across the spectrum of the beams is scarcely detectable. If it is desired to have, for certain applications, equal spacing of the light spots on the output plane, an optical corrector may be located in the primary output beams 56 to effect the said spot spacing equalization.

A seven frequency character printing system of the nature described in the Hrbek et al patent, but constructed to implement the described improvement, with acoustic carrier frequencies selected such that secondary beams 54 are equally spaced, has been built and has printed 2,000 lines of characters per minute without any significant loss of printing data at modulator optical efficiencies between 70 percent and 85 percent. A 25 percent non-linearity in the spacing of the seven primary (writing) beams resulted, however this degree of non-linearity was found to be difficult to detect on a printed page and not considered to be objectionable. The character generation system described and tested, had the following carrier frequencies:

$f_1$ (the minimum frequency) = 30.000 MHz
$f_2 = f_1 + \Delta f = 33.1746$ MHz
$f_3 = f_2 + \Delta f + f_d = 36.4127$ MHz
$f_4 = f_3 + \Delta f + 2f_d = 39.7143$ MHz
$f_5 = f_4 + \Delta f + 3f_d = 43.0794$ MHz
$f_6 = f_5 + \Delta f + 4f_d = 46.5080$ MHz
$f_7 = f_6 + \Delta f + 5f_d = 50.0001$ MHz
Bandwidth = 20 MHz Difference frequency (minimum) = 3.1746 MHz $\Delta f$ is the minimum dispersion frequency and $f_d$ is the dispersion frequency.

It is contemplated that the principles of this invention can be implemented by using other formulas or guide lines for the selection of carrier frequencies to avoid the afore-described drop-outs in the displayed images. Rather than selecting frequencies such that the frequencies representing differences between each carrier frequency and all others are equally spaced in the frequency domain, other spacing criterion can be employed. As a second example, the dispersion of the frequencies to achieve the desired suppression of drop-outs can be chosen as follows:

$f_1$ = minimum frequency
$f_2 = f_1 + \Delta f$
$f_3 = f_2 + \Delta f + f_d/5$
$f_4 = f_3 + \Delta f + 2f_d/5 + f_d/4$
$f_5 = f_4 + \Delta f + 3f_d/5 + 2f_d/4 + f_d/3$
$f_6 = f_5 + \Delta f + 4f_d/5 + 3f_d/4 + 2f_d/3 + f_d/2$
$f_7 = f_6 + \Delta f + 5f_d$ Here again $\Delta f$ is the minimum difference frequency and $f_d$ is the dispersion frequency. Still other prescriptions for selecting carrier frequencies can be used to implement the above-described principles of this invention.

Figure 4:
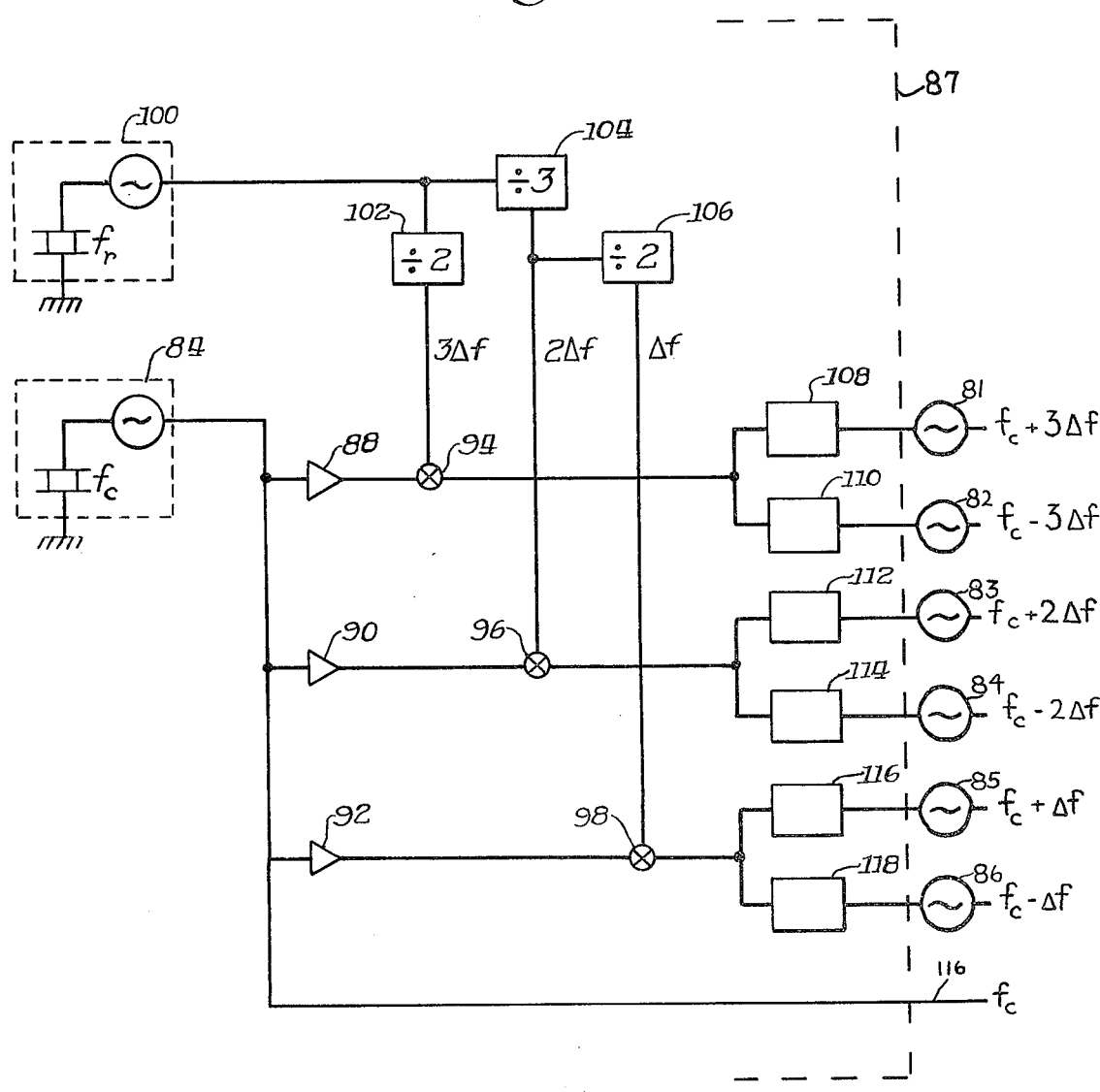
FIG. 4 is a block diagram of a system representing an alternative implementation of the principles of this invention.

In each of the afore-described embodiments of the invention, the problem of spurious modulation of the writing beams has been overcome by a selection, according to the teachingss of this invention, of a predetermined pattern of carrier frequencies. Alternatively, the carrier frequencies may be selected as in the prior art Hrbek et al patent (that is the frequencies may be selected such that the primary output beams are equally spaced in the frequency domain), however, the carriers in that case are, in accordance with this invention, caused to be phase locked so as to prevent interference effects in the Bragg cell. FIG. 4 depicts an alternative embodiment of the principles of this invention which employs this latter method of employing phase-locked carriers to suppress drop-outs in the displayed images.

In FIG. 4 there is illustrated a system for producing seven phase-locked carrier signals which may be supplied, for example, to a multiple-channel information translation system as shown in FIG. 2. Six phase-locked oscillators are shown at 81, 82, 83, 84, 85 and 86. A phase-locking system 87 is provided for phase locking the oscillators 81–86.

The phase-locking system 87 is illustrated as including a carrier generator, shown schematically at 91, for generating an RF carrier of predetermined frequency. The carrier generator 91 typically may comprise a crystal-controlled oscillator. The output of carrier generator 91 is fed in parallel through amplifiers 88, 90 and 92 to mixers 94, 96 and 98. A reference oscillator 100 for producing a reference CW (continuous wave) signals at a reference frequency $f_r$ is shown at 100 and may also comprise a crystal-controlled oscillator.

As will become evident, the reference frequency is chosen to be a multiple (here six) of the selected frequency difference $\Delta f$ between the carriers to be generated. The reference CW signal developed by the reference oscillator 100 is divided by two by a frequency divider 102 and supplied to mixer 94. The reference signal is also divided by three in a frequency divider 104 and supplied to mixer 96. The output from frequency divider 104 is divided again by two in a frequency divider 106 and supplied to mixer 98.

The output from mixer 94 is fed to an upper sideband filter 108 developing a signal at $f_c + 3\Delta f$, where $f_c$ is the carrier frequency and $\Delta f$ is the difference frequency. The output from mixer 94 is also supplied to a filter 110 which yields a signal at $f_c - 3\Delta f$. By way of example, assume that the carrier frequency $f_c$ developed by carrier generator 84 equals 40 MHz and reference signal frequency $f_r$ is 3 MHz. Thus $\Delta f = 0.5$ MHz. The sum signal component developed at the output of the filter 108 is $f_c + 3\Delta f$, which is $40 + 3(0.5) = 41.5$ MHz. The difference signal component developed at the output of filter 110 is $40 - 3(0.5) = 38.5$ MHz. Similarly, the sum and difference carrier signals developed at the outputs of an upper sideband filter 112 and a lower sideband filter 114 coupled to mixer 96 represent $f_c + 2\Delta f$ (41 MHz in the illustrated example) and $f_c - 2\Delta f$ (39 MHz in the illustrated example). Upper sideband filter 116 and lower sideband filter 108 coupled to the mixer 98 develops carriers having RF frequencies of 40.5 and 39.5 MHz, respectively. The filters 108, 110, 112, 114, 116 and 118 may be of the general type known as narrow-band bandpass filters.

Thus, at the output of the filters 108–118 there is developed six carriers between 38.5 and 41.5 MHz which are locked tightly together in common phase. However, due to the spectrum-analytic properties of a Bragg cell, it is important that the six carriers developed at the output of the filters 108–118 are, as nearly as possible, pure sinusoidal waves free of harmonics and distortion. To this end, oscillators 81–86 preferably have a high "Q" and may, e.g., be of the phase-locked-loop type. An oscillator of the phase-locked-loop type typically comprises a phase detector (which would here be coupled to the output of one of the filters), supplying a VCO (voltage-controlled oscillator) through a low-pass filter. A feedback loop from the VCO to the phase detector causes the phase of the VCO and its frequency to coincide with that of the input to the phase detector.

A seventh carrier at the frequency $f_c$ (40 MHz in this example) is derived directly from the carrier generator 84 and is available on lead 116. The carrier $f_c$ is inherently phase locked to the outputs of oscillators 81–86.

By the use of phase-locked carriers, as produced for example, by a system such as shown in FIG. 4, the relative phase relationship of the primary and secondary beams is fixed and predetermined to preclude the afore-described drop-outs which occur in the prior art systems.

In accordance with this last-described embodiment of the principles of this invention, the seven carriers developed may represent the data signal source for a system of the character shown in FIG. 2. In a system for displaying continuous tone images, carrier signals of appropriate number would be amplitude modulated by the developed channels of information and the resultant amplitude-modulated carrier signals would be supplied to a Bragg cell, as above described.

The invention is not limited to the particular details of construction of the apparatus and methods depicted and other modifications and applications are contemplated. Certain changes may be made in the above-described methods and apparatus without departing from the true spirit and scope of the invention herein involved and it is intended that the subject matter in the above depiction shall be interpreted as illustrative and not in a limiting sense.

I claim:

1. A multiple-channel information translation system for receiving a spatially coherent input light beam and a plural number greater than two of electrical input signals and for producing therefrom a like plural number of output light beams, each bearing amplitude information corresponding to one of said input signals, comprising:

carrier generating means for generating a plural number greater than two of electrical carriers, each having a different RF frequency;

modulating means for respectively amplitude modulating said carriers with the input signals to produce a like plural number of amplitude-modulated carrier signals; and a light-sound interaction cell interposed in the path of the input light beams, said cell including a sound-propagative medium and transducer means coupled to said sound-propagative medium which receives said carrier signals and launches within said medium a corresponding plural number of acoustic beams, each having an acoustic frequency and amplitude modulation corresponding to a different one of said carrier signals, said cell Bragg-diffracting the input beam into a corresponding plural number of output light beams respectively amplitude modulated in accordance with the input signals, said carrier generating means causing the frequencies of said carriers to be unequally spaced and such that the frequency differences between each carrier frequency and all others are unequal so as to substantially suppress random, signal-related spurious amplitude modulation of said output beams.

2. A multiple-channel information translation system for receiving a spatially coherent input light beam and a plural number greater than two of electrical input signals and for producing therefrom a like plural number of output light beams each bearing amplitude information corresponding to one of said input signals, comprising:

carrier generating means for generating a plural number greater than two of electrical carriers each having a different RF frequency;

modulating means for respectively amplitude modulating said carriers with the input signals to produce a like plural number of amplitude-modulated carrier signals; and a Bragg light-sound interaction cell interposed in the path of the input light beam, said cell including a sound-propagative medium and transducer means coupled to said sound-propagative medium which receives said carrier signals and launches within said medium a corresponding plural number of sound beams, each having a sound frequency and amplitude modulation corresponding to a different one of said carrier signals, said cell Bragg-diffracting the input beam into a corresponding plural number of output light beams respectively amplitude modulated in accordance with the input signals, said carrier generating means causing the frequencies of said carriers to be unequally spaced and such that the frequency differences between each carrier frequency and all others are unequal so as to suppress cross-channel interference effects in said cell and thereby to suppress random, signal-related spurious amplitude modulation of said output light beams.

3. The system defined by claim 2 wherein said frequency differences are substantially equally spaced in the frequency domain.

4. A laser character generating system for receiving a laser beam and electrical input signals representing image information and for producing therefrom light-formed images for recording or display, comprising:

carrier generating means for generating a plural number greater than two of electrical carriers each having a different RF frequency;

modulating means for receiving image information and for respectively amplitude modulating said carriers with the input signals so as to produce a like plural number of amplitude-modulated carrier signals each characterizing a different line in a raster of image lines defining an image to be displayed or recorded;

a Bragg light-sound interaction cell interposed in the path of the input light beam, said cell including a sound-propagative medium and transducer means coupled to said sound-propagative medium which receives said carrier signals and launches within said medium a corresponding plural number of sound beams each having a sound frequency and amplitude modulation corresponding to a different one of said carrier signals, said cell Bragg-diffracting the input beam into a corresponding plural number of coplanar, angularly separated output light beams respectively amplitude modulated in accordance with the input signals; and means for deflecting said output light beams as a fan of beams in a direction perpendicular to the plane containing said beams so as to simultaneously sweep out a raster of image lines defining an image at an output plane, said carrier generating means causing the frequencies of said carriers to be unequally spaced and such that the frequency differences between each carrier frequency and all others are unequal so as to suppress cross-channel interference effects in said cell tending to produce random, signal-related spurious amplitude modulation of said output beams.

5. The system defined by claim 4 wherein said frequency differences are substantially equally spaced in the frequency domain.

6. A laser character generating system for receiving a laser beam and electrical input signals representing character information and for producing therefrom light-formed alphanumeric characters for recording or display, comprising:

carrier generating means for generating a plural number greater than two of electrical carriers each having a differennt RF frequency;

modulating means for receiving the input signals representing character information and for respectively gating said carriers with the input signals so as to produce a like plural number of gated carrier signals, each characterizing a different line in a raster of image lines defining a line of characters;

a Bragg light-sound interaction cell interposed in the path of the input light beam, said cell including a sound-propagative medium and transducer means coupled to said sound-propagative medium which receives said carrier signals and launches within said medium a corresponding plural number of sound beams each having a sound frequency and amplitude characteristic corresponding to a different one of said carrier signals, said cell Bragg-diffracting the input beam into a corresponding plural number of coplanar, angularly separated primary output light beams respectively gated in accordance with the input signals; and means for deflecting said output light beams as a fan of beams in a direction perpendicular to the plane containing said beams so as to simultaneously sweep out a raster of image lines defining a line of characters at an output plane, said carrier generating means causing the frequencies of said carriers to be unequally spaced and such that the frequency differences between each carrier frequency and all others are unequal so as to suppress cross-channel interference effects in said cell tending to produce random, signal-related spurious amplitude modulation of said output beams.

7. The system defined by claim 9 wherein said frequency differences are substantially equally spaced in the frequency domain.

8. A method for generating and presenting images or alphanumeric characters from an input laser beam and electrical input signals representing image or character information, comprising:
   generating a plural number greater than two of electrical carriers, each having a different RF frequency;
   amplitude modulating each of said carriers respectively with an input signal so as to produce a like plural number of modulated carrier signals each characterizing a different line in raster of image lines defining an image or a line of characters to be presented;
   supplying said carrier signals to a Bragg light-sound cell and Bragg-diffracting at least part of the input laser beam into a like plural number of coplanar, angularly separated first order output light beams, each amplitude-modulated in accordance with a different one of said input signals; and
   deflecting said output light beams as a fan of beams in a direction perpendicular to the plane containing said output beams so as to simultaneously sweep out a raster of image lines defining an image or a line of characters at an output plane,
   said method being characterized by selecting the frequencies of said carriers to be unequally spaced and such that the frequency differences between each carrier frequency and all others are unequal so as to suppress cross-channel interference effects in said cell tending to produce random, signal-related spurious amplitude modulation of said output beams.

9. The method defined by claim 8 wherein said frequency differences are substantially equally spaced in the frequency domain.

10. For use with a multiple-channel information translation system including a Bragg-type light-sound interaction cell which receives a spatially coherent light beam and a plurality of modulated RF carrier signals and produces therefrom a plurality of diffracted output beams modulated respectively in accordance with the carrier signals, a method for suppressing cross-channel interference effects in the cell tending to produce signal-related spurious modulation of the outlet beams, comprising driving the cell with at least three carrier signals whose carrier frequencies are unequally spaced and selected such that the frequency differences between each carrier frequency and all others are unequal.

11. The method defined by claim 10 wherein said frequency differences are substantially equally spaced in the frequency domain.

* * * * *